US008538270B2

(12) United States Patent  
Seidel et al.

(10) Patent No.: US 8,538,270 B2
(45) Date of Patent: Sep. 17, 2013

(54) PHOTONIC RF FREQUENCY CONVERSION

(75) Inventors: David Seidel, Alta Loma, CA (US); Vladimir S. Ilchenko, Arcadia, CA (US); Andrey B. Matsko, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 358 days.

(21) Appl. No.: 12/912,611

(22) Filed: Oct. 26, 2010

(65) Prior Publication Data

US 2011/0150485 A1    Jun. 23, 2011

Related U.S. Application Data

(60) Provisional application No. 61/254,854, filed on Oct. 26, 2009.

(51) Int. Cl.  
*H04B 10/00* (2013.01)

(52) U.S. Cl.  
USPC ........... 398/140; 398/115; 398/182; 398/183; 398/201; 372/21; 372/26; 372/69

(58) Field of Classification Search  
USPC ........................................ 372/26–32; 385/50  
See application file for complete search history.

(56) References Cited

U.S. PATENT DOCUMENTS

| 6,873,631 | B2 * | 3/2005 | Yao et al. ........................ 372/32 |
| 7,062,131 | B2 * | 6/2006 | Ilchenko ......................... 385/50 |
| 2008/0075464 | A1 * | 3/2008 | Maleki et al. ................... 398/85 |
| 2008/0240180 | A1 * | 10/2008 | Matsui et al. ................... 372/26 |
| 2009/0263137 | A1 * | 10/2009 | Hossein-Zadeh et al. .... 398/115 |

OTHER PUBLICATIONS

Savchenkov, Anatoliy A., et al., "RF photonic signal processing components: From high order tunable filters to high stability tunable oscillators", Radar Conference, 2009, IEEE, IEEE Piscataway, NJ, USA, May 4, 2009; pp. 1-6.  
Hossein-Zadah M., et al., "Electro-optic bistability in a LiNbO3 microdisk resonator", IET Optoelectronics, vol. 2, No. 3, Jun. 9, 2008, pp. 111-114.  
Savchenkov, A. A., et al, "Tunable optical single-sideband modulator with complete sideband suppression", Optics Letters, vol, 34, No. 9, May 1, 2009, pp. 1300-1302.  
Ilchenko, V.S., et al., "Whispering-gallery mode based photonic RF receiver", 2010 IEEE/MIT-S International Microwave Symposium, MTT, 2010, pp. 744-747.  
European Search Report from European Patent Application No. EP 10 01 3973 filed Oct. 26, 2010, dated Feb. 2, 2011, 6 pages.

* cited by examiner

*Primary Examiner* — Li Liu  
(74) *Attorney, Agent, or Firm* — Perkins Coie LLP

(57) ABSTRACT

Devices and techniques for frequency conversion of radio frequency (RF) or microwave signals based on photonic processing.

20 Claims, 10 Drawing Sheets

PHOTONIC RF FREQUENCY CONVERSION

PRIORITY CLAIM AND RELATED APPLICATION

This patent document claims the benefits of U.S. Provisional Application. 61/254,854 entitled "Photonic RF Frequency Up- and Down-Converter" and filed Oct. 26, 2009, the entire disclosure of which is incorporated by reference as part of this document.

BACKGROUND

This document relates to devices and techniques for frequency conversion of radio frequency (RF) or microwave signals based on photonic processing.

RF or microwave signal processing can be achieved by using photonic components to perform certain signal processing operations in the optical domain to achieve certain technical advantages or benefits that may be difficult to achieve using electrically conductive RF or microwave components. In operation, an RF or microwave signal can be modulated onto an optical signal for photonic processing and an optical-to-electrical conversion is then performed to convert the optical signal into a desired RF or microwave signal. Examples of RF or microwave signal processing via photonic processing include, among others, generation of RF or microwave signals using opto-electronic oscillators, filtering or tuning of RF or microwave signals using photonics, using photonic components for receiving RF or microwave signals.

SUMMARY

This document discloses, among others, examples and implementations of devices and techniques for frequency conversion of radio frequency (RF) or microwave signals based on photonic processing.

In one aspect, a method is provided for converting a frequency of a signal based on photonic processing. This method includes producing a modulated optical signal that is at an optical carrier frequency and carries an input radio frequency (RF) signal; coupling light of the modulated optical signal into an optical resonator that supports optical resonator modes and exhibits a frequency difference between two adjacent optical resonator modes that is different from an RF frequency of the input RF signal; coupling light out of the optical resonator as an optical output signal that carries a first set of optical sidebands corresponding to the RF signal and a second set of optical sidebands corresponding to the optical resonator modes; and using an optical detector to convert the optical output signal into an output electrical signal that is a replica of the input RF signal at an output electrical signal frequency that is shifted from the RF frequency of the input RF signal.

In another aspect, a device for converting a frequency of a signal based on photonic processing is provided to include an electrical to optical conversion module that receives an input radio frequency (RF) signal and produces a modulated optical signal that is at an optical carrier frequency and carries the input RF signal; an optical resonator that supports optical resonator modes and exhibits a frequency difference between two adjacent optical resonator modes that is different from an RF frequency of the input RF signal; an optical coupler that couples light of the modulated optical signal into the optical resonator and couples light out of the optical resonator as an optical output signal that carries a first set of optical sidebands corresponding to the RF signal and a second set of optical sidebands corresponding to the optical resonator modes; and an optical detector located to receive the optical output signal coupled out of the optical resonator. The optical detector converts the received optical output signal into an output electrical signal that is a replica of the input RF signal at an output electrical signal frequency that is shifted from the RF frequency of the input RF signal.

In yet another aspect, a device for converting a frequency of a signal based on photonic processing is provided to include an electrical to optical conversion module that receives an input radio frequency (RF) signal and produces a modulated optical signal that is at an optical carrier frequency and carries the input RF signal; and a photonic oscillator that includes a closed opto-electronic loop having an optical part that includes an optical resonator, an electrical part and a loop optical detector coupled between the optical part and the electrical part to convert light received from the optical part into an electrical signal to the electrical part. The optical resonator is configured to support optical resonator modes and to exhibit a frequency difference between two adjacent optical resonator modes that is different from an RF frequency of the input RF signal. This device includes an optical coupler that couples light of the modulated optical signal into the optical resonator and couples light out of the optical resonator as an optical output signal that carries a first set of optical sidebands corresponding to the RF signal and a second set of optical sidebands corresponding to the optical resonator modes; and an optical detector located to receive the optical output signal coupled out of the optical resonator, the optical detector converting the received optical output signal into an output electrical signal that is a replica of the input RF signal at an output electrical signal frequency that is shifted from the RF frequency of the input RF signal.

In one implementation of the above device, the electrical to optical conversion module can include a laser which produces laser light at the optical carrier frequency and is optically coupled to the optical resonator via the optical coupler to be optically locked to an optical resonator mode via injection locking.

In another implementation of the above device, the optical resonator supports optical whispering gallery modes and the optical coupler is an evanescent optical coupler. The optical resonator may be made of an electro-optic crystal and structured to support optical whispering gallery modes in two orthogonally polarized transverse electric (TE) modes and transverse magnetic (TM) modes circulating near a rim of the optical resonator. The device may include electrodes formed on the optical resonator to receive an electrical signal from the electrical part in an electric field polarization oriented relative to a crystal axis of the electro-optic crystal to effectuate coupling between an optical whispering gallery mode in the TE mode and another optical whispering gallery mode in the TM mode to produce an optical single sideband on light in the optical resonator at a frequency different from the optical carrier frequency; and a frequency control mechanism coupled to the optical resonator to tune a frequency spacing between the optical single sideband and the optical carrier frequency. An optical polarizer may be located in an optical path between the optical resonator and the optical detector to reject the light at the optical carrier frequency and to transmit light of the optical single sideband.

These and other aspects, associated examples and implementations are described in detail in the drawings, the description, and the claims.

DETAILED DESCRIPTION

Figure 1A:
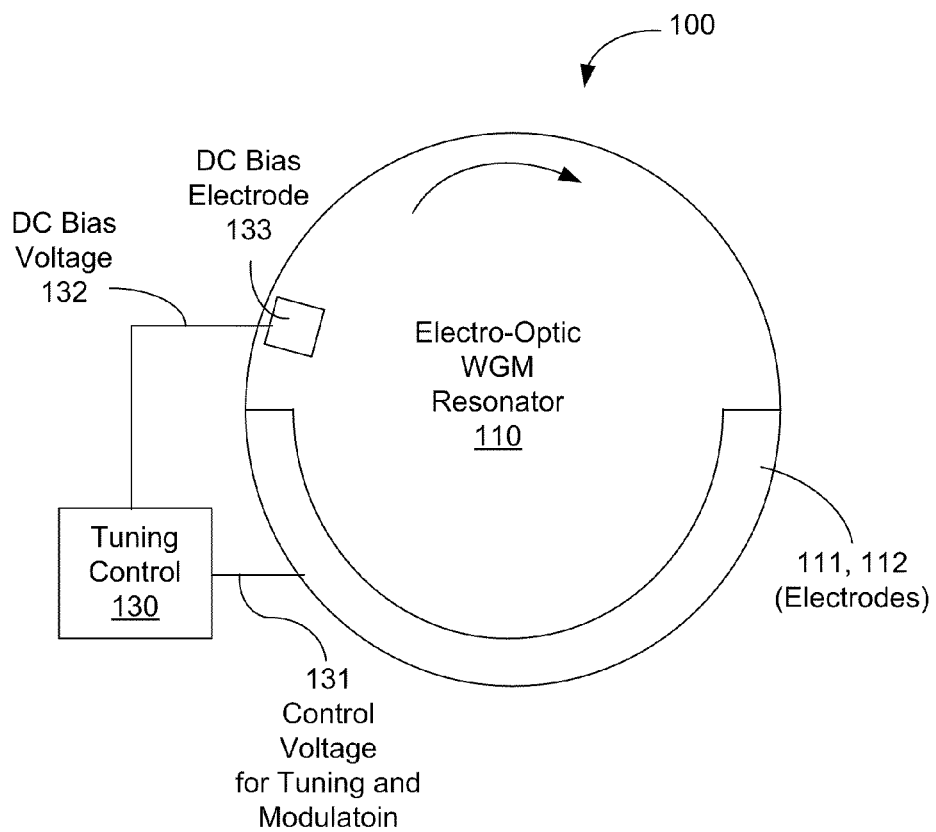
FIGS. 1A and 1B show an example of a tunable electro-optic WGM resonator modulator that can be used for opto-electronic oscillations or single sideband (SSB) modulation.

The devices and techniques disclosed here for frequency conversion of radio frequency (RF) or microwave signals use an optical resonator to perform part of the photonic processing for the frequency conversion. A modulated optical signal at an optical carrier frequency is produced to carry an input RF signal and is coupled into the optical resonator. The optical resonator is designed to support multiple optical resonator modes where the frequency difference between two adjacent optical resonator modes is different from the RF frequency of the input RF signal. The light inside the optical resonator has a first set of optical sidebands corresponding to the RF signal and a second set of optical sidebands corresponding to the optical resonator modes. This light is coupled out of the resonator and is directed into an optical detector which produces an output electrical signal as a replica of the input RF signal at a signal frequency that is either down shifted or up shifted from the RF frequency of the input RF signal.

The optical resonator can be in various configurations. Optical whispering gallery mode (WGM) resonators are special optical resonators that confine light in one or more whispering gallery modes. Light in a whispering gallery mode propagates in a closed circular optical path and is reflected at the boundary of the resonator due to the total internal reflection. Such as, light in a WGM resonator "leaks" out of the exterior surface of the closed circular optical path of a WGM resonator via the evanescence field of the WG mode. An optical coupler can be used to couple light into or out of the WGM resonator via this evanescent field.

WGM resonators can be structured to be axially or cylindrically symmetric around a symmetry axis around which the WG modes circulate in a circular path or the equator. The exterior surface of such a resonator is smooth and provides spatial confinement to light around the circular plane to support one or more WG modes. The exterior surface may be curved toward the symmetry axis to spatially confine the light along the symmetry axis. A WGM resonator may be shaped symmetrically around a symmetry axis and has a protruded belt region to form a circular path to confine light in one or more WG modes. The exterior surface of the protruded belt region may be any suitable geometrical shape such as a flat surface or a curved surface. Such a WGM resonator may be configured in a desired physical size for a given wavelength of light. Various materials can be used for WGM resonators and include, for example, crystal materials and non-crystal materials. Some examples of suitable dielectric materials include fused silica materials, glass materials, lithium niobate materials, and calcium fluoride materials.

A whispering gallery mode resonator can be made of a material exhibiting an electro-optic effect and can include electrodes on the optical resonator to apply an RF or microwave signal to the optical resonator to effectuate the electro-optic effect to control the one or more optical whispering gallery modes circulating along a circular optical loop near a rim of the optical resonator. The electro-optic effect in such a WGM resonator can be used to tune the resonance of the WGM resonator and to modulate light.

Figure 1B:
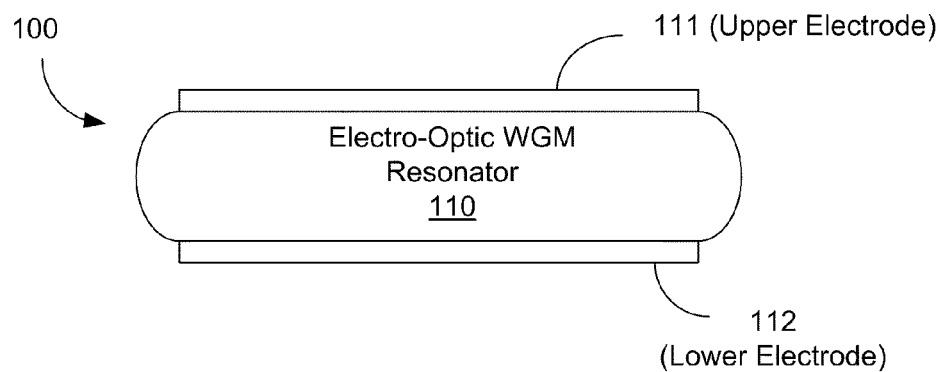

FIGS. 1A and 1B show an example of an electro-optic modulator (EOM) 100 having an electro-optic WGM resonator 110. The electro-optic material for the entire or part of the resonator 110 may be an electro-optic crystal or a semiconductor multiple quantum well structure. One or more electrodes 111 and 112 may be formed on the resonator 110 to apply a control electrical field in at least the region where the WG modes are present to control the index of the electro-optical material and to change the filter function of the resonator. Assuming the resonator 110 has disk or ring geometry, the electrode 111 may be formed on the top of the resonator 110 and the electrode 112 may be formed on the bottom of the resonator 110 as illustrated in the side view of the device in FIG. 1B. In one implementation, the electrodes 111 and 112 may constitute an RF or microwave resonator to apply the RF or microwave signal to co-propagate along with the desired optical WG mode. For example, the electrodes 111 and 112 may be microstrip line electrodes. The electrodes 111 and 112 may also form an electrical waveguide to direct the electrical control signal to propagate along the paths of the WG modes. A tuning control unit 130 such as a control circuit may be used to supply the electrical control signal 131 to the electrodes 111 and 112.

In operating the resonator modulator 100, the control unit 130 may supply a voltage as the electrical control signal to the electrodes 111 and 112 as the modulation control signal. A DC bias electrode 133 can be provided to supply a DC voltage 132 to set the resonance peak of the resonator 100 at a desired spectral location. The DC voltage may be adjusted by the control unit 630 to tune the spectral position of the transmission peak when such tuning is needed.

For example, a Z-cut $LiNbO_3$ disk cavity with a diameter of d=4.8 mm and a thickness of 170 μm may be used as the resonator 610. The cavity perimeter edge may be prepared in the toroidal shape with a 100 μm radius of curvature. As an alternative to the strip electrodes shown in FIG. 1A, the top and bottom surfaces of the disk resonator may be coated with conductive layers for receiving the external electrical control signal. A metal such as indium may be used to form the conductive coatings. The signal modulation is achieved by applying and adjusting a modulation control voltage to the top and bottom conductive coatings. Each conductive coating may be absent on the central part of the resonator and are present at the perimeter edge of the resonator where WGMs are localized.

For the frequency conversion, the optical resonator can be part of an opto-electronic oscillator (OEO) in some implementations. An OEO is based on an electro-optic feedback loop that directly converts light energy to spectrally pure RF radiation. The OEO performance does not degrade with RF frequency, and an OEO operating at, e.g., 5 GHz, has the same noise performance as one operating at 60 GHz, assuming the same amplifier noise for the two examples. This is a useful feature for radio over fiber (RoF) applications.

An opto-electronic oscillator (OEO) is an oscillator with a positive feedback loop that has both electronic and optical components. See, e.g., U.S. Pat. No. 5,723,856 to Yao and Maleki and U.S. Pat. No. 5,777,778 to Yao, which are incorporated by reference as part of the specification of this document. Such an OEO includes an electrically controllable optical modulator and at least one active opto-electronic feedback loop that comprises an optical part and an electrical part interconnected by a photodetector. The opto-electronic feedback loop receives the modulated optical output from the modulator and converted it into an electrical signal to control the modulator. The loop produces a desired delay and feeds the electrical signal in phase to the modulator to generate and sustain both optical modulation and electrical oscillation at the modulation frequency of the modulator when the total loop gain of the active opto-electronic loop and any other additional feedback loops exceeds the total loss. OEOs use optical modulation to produce oscillations in frequency spectral ranges that are outside the optical spectrum, such as in RF and microwave frequencies. The generated oscillating signals are tunable in frequencies and can have narrow spectral linewidths and low phase noise in comparison with the signals produced by other RF and microwaves oscillators. Notably, the OEOs are optical and electronic hybrid devices and thus can be used in various applications.

The examples of OEOs described below use a whispering mode gallery mode resonator made of an electro-optic material as the optical modulator for modulating the CW laser light from a laser, to filter the modulated laser light and to provide at least a part of the optical delay in the feedback loop.

Figure 2:
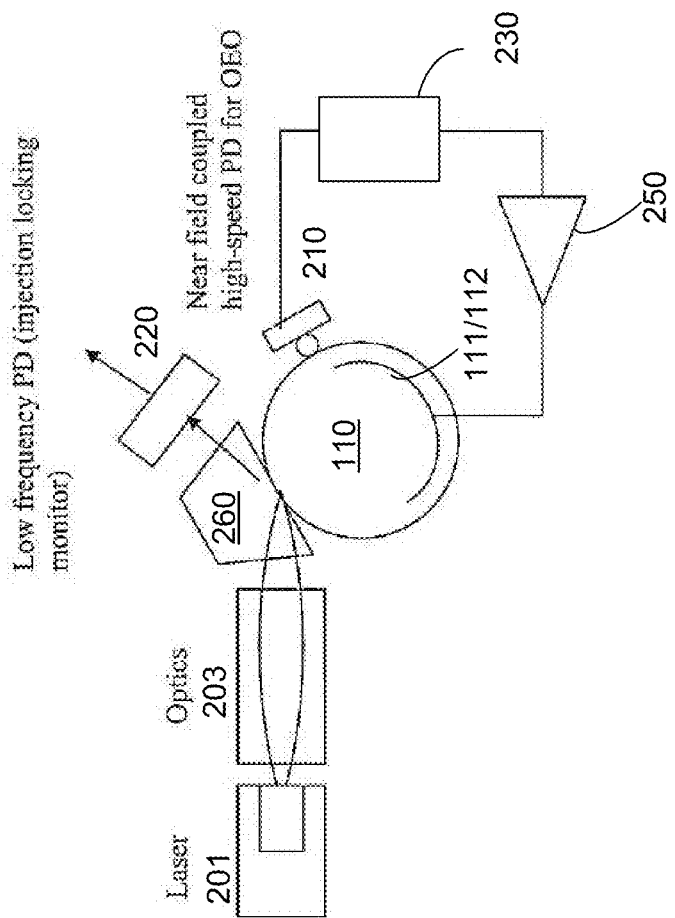
FIG. 2 shows an example of an opto-electronic oscillator (OEO) based on the resonator modulator in FIGS. 1A and 1B.

FIG. 2 shows one implementation of an RF receiver with a single WGM resonator for modulation and laser injection locking. A laser 201 in this example is used to produce a continuous wave laser beam which is coupled via optics 203 and an evanescent optical coupler 260 into the resonator 100. A near-field coupled high speed photodiode 210 is evanescently coupled the resonator 100 to detect light and to produce a detector signal to a feedback control circuit 230 which conditions the signal, e.g., controlling the phase or delay of the signal and filtering the signal to select a particular frequency in the feedback loop. An amplifier 250 may be connected downstream from the circuit 230 to amplify the signal as a feedback control signal to the resonator 100. This feedback control signal is fed into the electrodes 111, 112 on the resonator 100 to modulate the light inside the modulator 100. This design forms an opto-electronic loop with an optical portion that includes the optical resonator 100 as an optical delay element and an optical modulator, and an electrical portion which includes the photodiode 210, the circuit 230, the amplifier 250 and the electrodes 111, 112. This is a closed loop and can be operated to have a loop gain higher than the loop loss and the feedback to the resonator 100 is kept in phase. Under such conditions, the closed loop is a positive feedback loop and can oscillate as an opto-electronic oscillator (OEO) at a frequency at which the light in the resonator 100 is modulated. In this OEO, the laser light from the laser 201 is modulated due to the feedback light from the resonator 100. The resonator 100 provides the optical delay in the loop to reduce the phase noise of the loop that may be difficult to achieve with a conventional RF voltage-controlled oscillator. A second detector 220 is used to provide low frequency detection for monitoring the injection locking operation.

The electro-optic modulator (EOM) in FIGS. 1A and 1B may be constructed based on coupling between WGM modes of the same polarization via the electro-optic effect. Such EOM devices can be tuned in frequency but the tuning is limited by the free spectral range (FSR) of the WGM modes of the WGM resonator.

Certain electro-optic materials exhibit non-zero off-diagonal elements of their electro-optic tensors and can be used to effectuate coupling of two orthogonally polarized WG modes of an electro-optic WGM resonator modulator via interaction with the applied RF or microwave (MW) signal. This RF/MW-coupled interaction between two family modes of orthogonal polarizations, e.g. the transverse magnetic (TM) mode and the transverse electric (TE) mode, can be used to construct an electro-optic WGM resonator modulator to achieve tunable single sideband (SSB) modulation. For example, based on the modulator design in FIGS. 1A and 1B, WGM resonators made of LiNbO$_3$ and LiTaO$_3$ or other electro-optic crystals with the desired non-zero off-diagonal elements of their electro-optic tensors can be used to create coupling between light and RF fields, achieved by engineering the shape of a micro-strip RF resonator coupled to a WGM resonator. The modulation is achieved between the WGM modes separated not by the free spectral range (FSR) of the resonator, but rather by some frequency given by the resonator shape, temperature, and the bias voltage.

The light confined in two optical WGMs characterized with electric field operators $\vec{E}_1$ and $\vec{E}_2$ is coupled with the RF field $\vec{E}_M$ in the case of nonzero interaction energy $$E = \frac{1}{8\pi} \int_V \sum_{i,j,k} r_{ijk} D_i D_j E_{Mk} \, dv,$$

where $r_{ijk}$ describes the space dependent electro-optic nonlinearity of the resonator host material, $D_i = \Sigma_l \in_{il} E_l$, electric field $E_l$ is presented as a sum of two counter-propagating waves, and V is the volume of the WGM resonator.

The interaction between two WGM mode families having different polarizations allows the two WGM mode families to be tuned with respect to each other using the same tuning mechanism, e.g., adjusting the DC bias voltage applied to the resonator. The interaction of two WGM mode families allows the single sideband modulation in the system.

The interaction between the light and RF signal is not always possible. For instance, if the RF field is homogeneous and is applied along, e.g., Z-axis of a lithium niobate WGM resonator, the coupling between the optical TM modes with the electric field parallel to the Z axis and the optical TE modes with the electric field perpendicular to the Z axis is forbidden. It is possible to realize resonators where neither pure TE nor pure TM mode families exist. The interaction is allowed among those modes if the spatial overlap integral between the modes is not zero.

Electro-optic materials with non-zero non-diagonal elements of their linear electro-optic tensors can be used to achieve interaction of two orthogonally polarized modes. For example, lithium niobate has nonzero electro-optic coefficients r42=r51. Those coefficients introduce coupling between TE and TM WGMs in a resonator fabricated from a z-cut LiNbO3 preform if the RF field has a radial component. The space averaged interaction energy for the optical and RF fields is given by $$E = \frac{n_e^2 n_o^2}{4\pi} \int_V r_{51} (\vec{E}_{TM} \cdot \vec{E}_{RF}) E_{TE}^* \, dv,$$

where the condition of $\vec{E}_{TE} = \vec{z} E_{TE}$ is applied. The averaged interaction energy is generally zero because $n_e \neq n_o$. However, either periodical poling of the material or creating a special electrode shape for the RF mode phase matches the interaction such that E≠0. A composite resonator can be fabricated from, e.g., x-cut and z-cut cylindrical segments attached together so that the nonzero interaction can be achieved.

Figure 3:
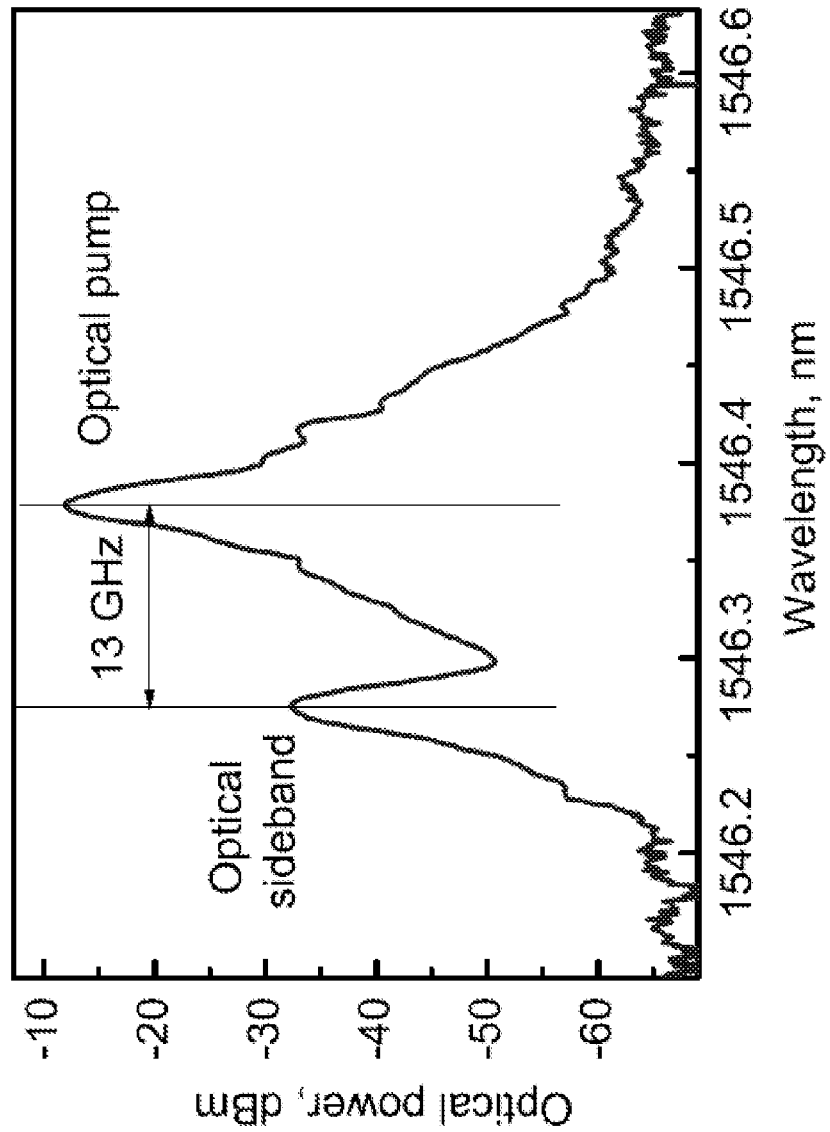
FIGS. 3 and 4 illustrate operations of the modulator for SSB modulation in FIGS. 1A and 1B.

FIG. 3 shows a measured optical spectrum obtained from an exemplary SSB EOM modulator using a lithium niobate crystal WGM resonator having a 35-GHz free spectral range. The interaction of TE and TM mode families was effectuated to achieve single sideband modulation where only one sideband was generated at the spacing of 13 GHz from the optical frequency of the optical pump light. The resonator modulation was achieved between the TE and TM modes separated not by the free spectral range (35 GHz) of the resonator, but rather by some value (13 GHz) given by the resonator shape, the resonator temperature, and the bias voltage applied to the resonator. For two WGM mode families having different polarizations, optical frequencies of the two mode families are shifted with respect to each other in the frequency space. As such, it is possible to realize single sideband tunable modulation in the system.

Figure 4:
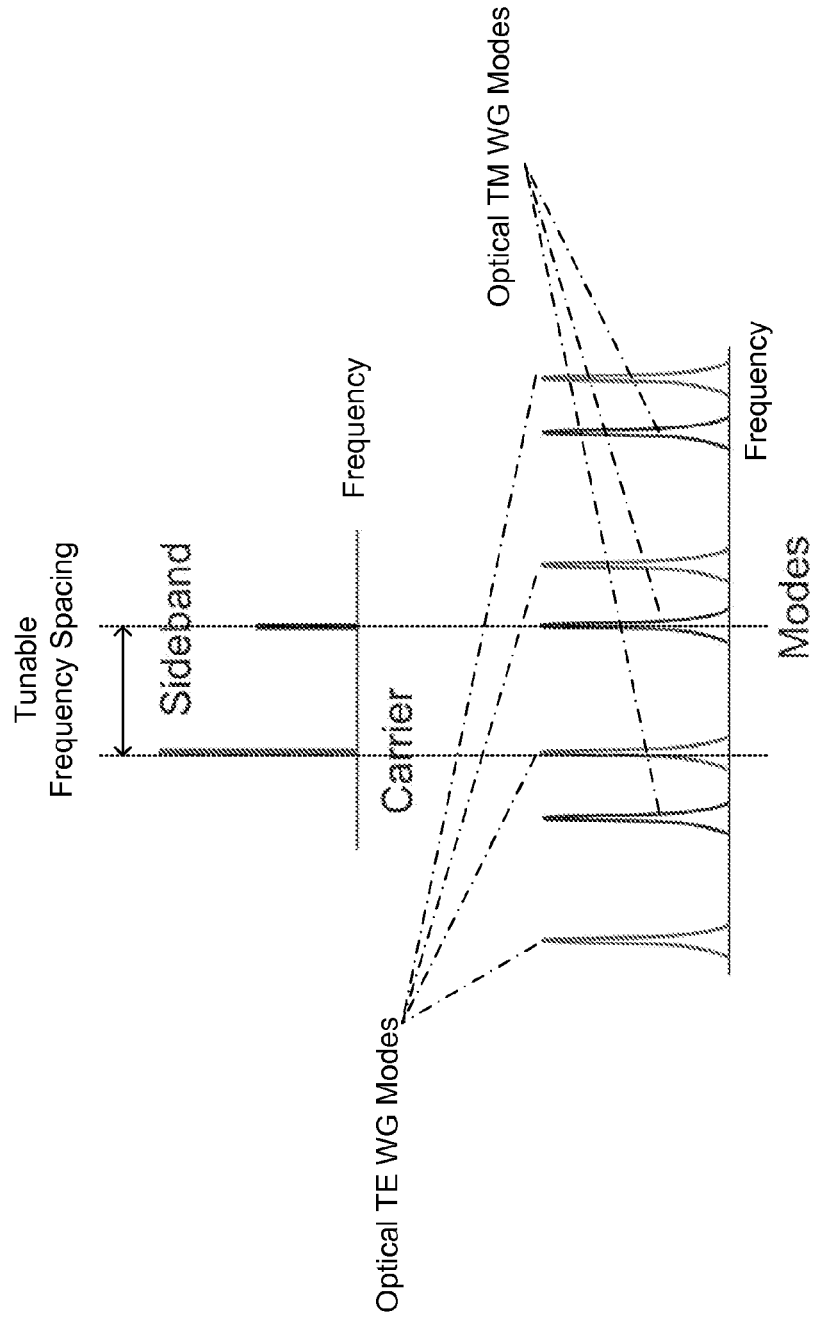

FIG. 4 illustrates the spectral properties of SSB modulation in an electro-optic WGM resonator modulator configured under the design in FIGS. 1A and 1B. The upper diagram shows the entire spectrum of the optical output of the electro-optic WGM resonator modulator without any optical filtering, where only a single modulation sideband is generated on one side of the optical carrier. The lower diagram shows two families of WG modes with orthogonal polarizations (TE and TM modes) that support light at the optical carrier frequency and the generated single sideband. This TE-TM waveguide mode coupling via off-diagonal elements of the electro-optic tensor of the modulator host material is a departure from the resonant electro-optic WGM resonator modulators based on coupling between modes of the same family (TE-TE or TM-TM) using diagonal elements of an electro-optic tensor of the host electro-optic material. Referring to FIGS. 1A and 1B, the shape of the RF electrodes applied to an electro-optic crystal (e.g., Z-cut lithium tantalite crystal) in a WGM resonator can be structured to effectuate an efficient coupling of TE whose electric field is perpendicular to the Z axis and TM whose electric field is parallel to the Z axis, where the Z axis is the symmetry axis of the resonator coinciding with the c axis of the crystal.

Notably, the TE and TM WGM modes respectively at the optical carrier frequency and the frequency of the single sideband in FIG. 4 is separated not by the optical free spectral range of the WGM resonator, but rather by some frequency determined by the electro-optic effect in the resonator, e.g., determined by one or combination of various influences that affect the electro-optic effect in the resonator, e.g., resonator shape, temperature, and the bias voltage. Based on this, the TE and TM mode families can be tuned with respect to one another using the electro-optic effect by changing the electro-optic coefficients for agile tunability of the modulation frequency which is the difference between the optical carrier and the frequency of the generated single sideband (upper diagram of FIG. 4). The tenability comes from the different response of the TE and the TM modes to an external energy or influence applied to the crystal for changing the electro-optic coefficients. One exemplary technique for tuning this frequency is to change a DC bias voltage on the crystal. One another exemplary technique for tuning this frequency change the temperature of the crystal. Yet another exemplary technique for tuning this frequency is to apply a force to compress the crystal.

In this regard, the SSB modulation provides a method for operating a WGM resonator to achieve SSB operation. This method includes coupling light into an optical resonator made of a crystal (e.g., a ferroelectric crystal) and structured to support optical whispering gallery modes in two orthogonally polarized TE and TM modes circulating along a circular optical loop near a rim of the optical resonator; and applying an RF or microwave signal to the optical resonator in an electric field polarization oriented relative to a crystal axis of the crystal to effectuate coupling between light in an optical whispering gallery mode in the TE mode and light in another optical whispering gallery mode in the TM mode to produce a tunable optical single sideband modulation at a modulation frequency equal to a difference in optical frequencies of the optical whispering gallery modes in the TE and TM modes.

Figure 5:
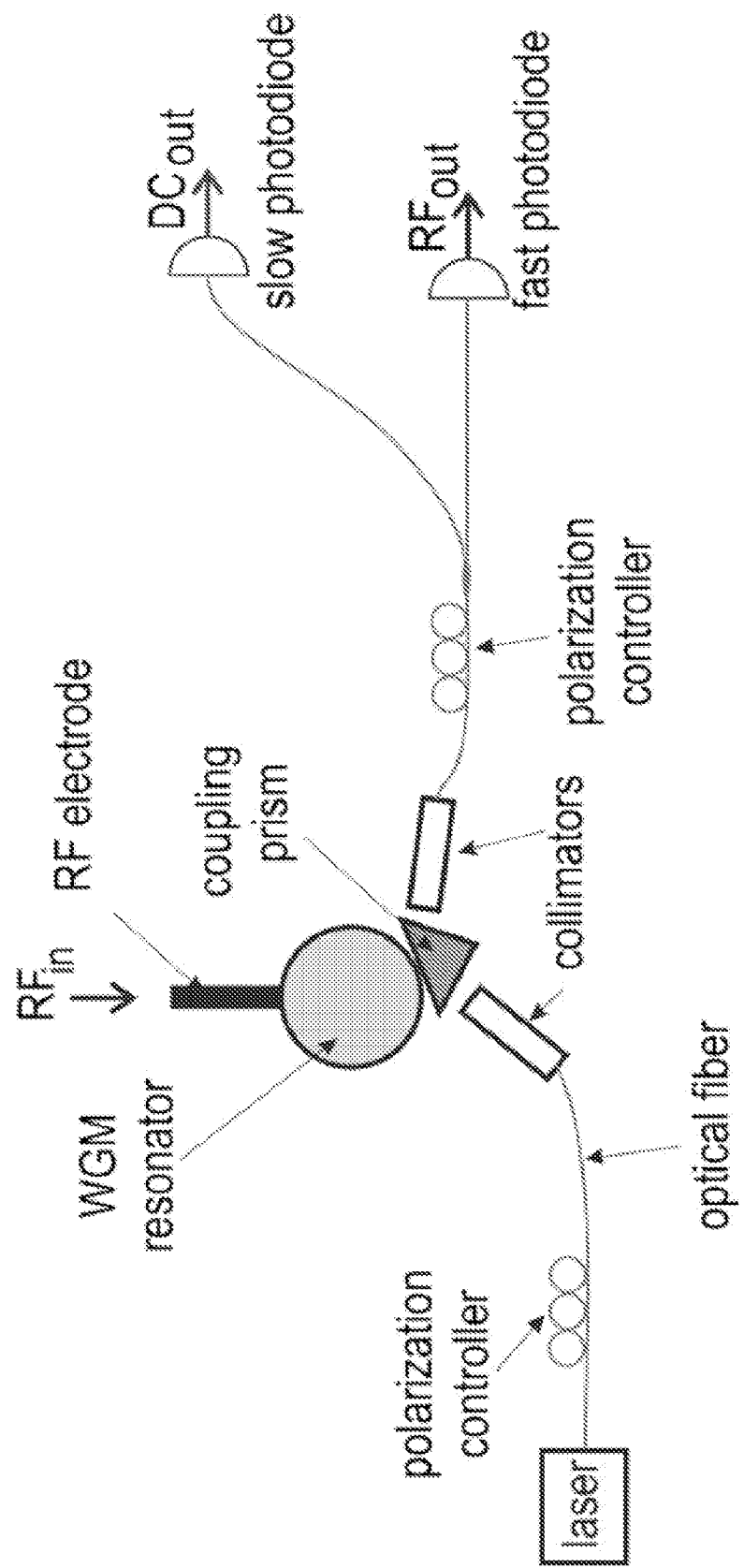
FIGS. 5 and 6 show examples of a tunable SSB WGM resonator modulator and an SSB OEO.
Figure 6:
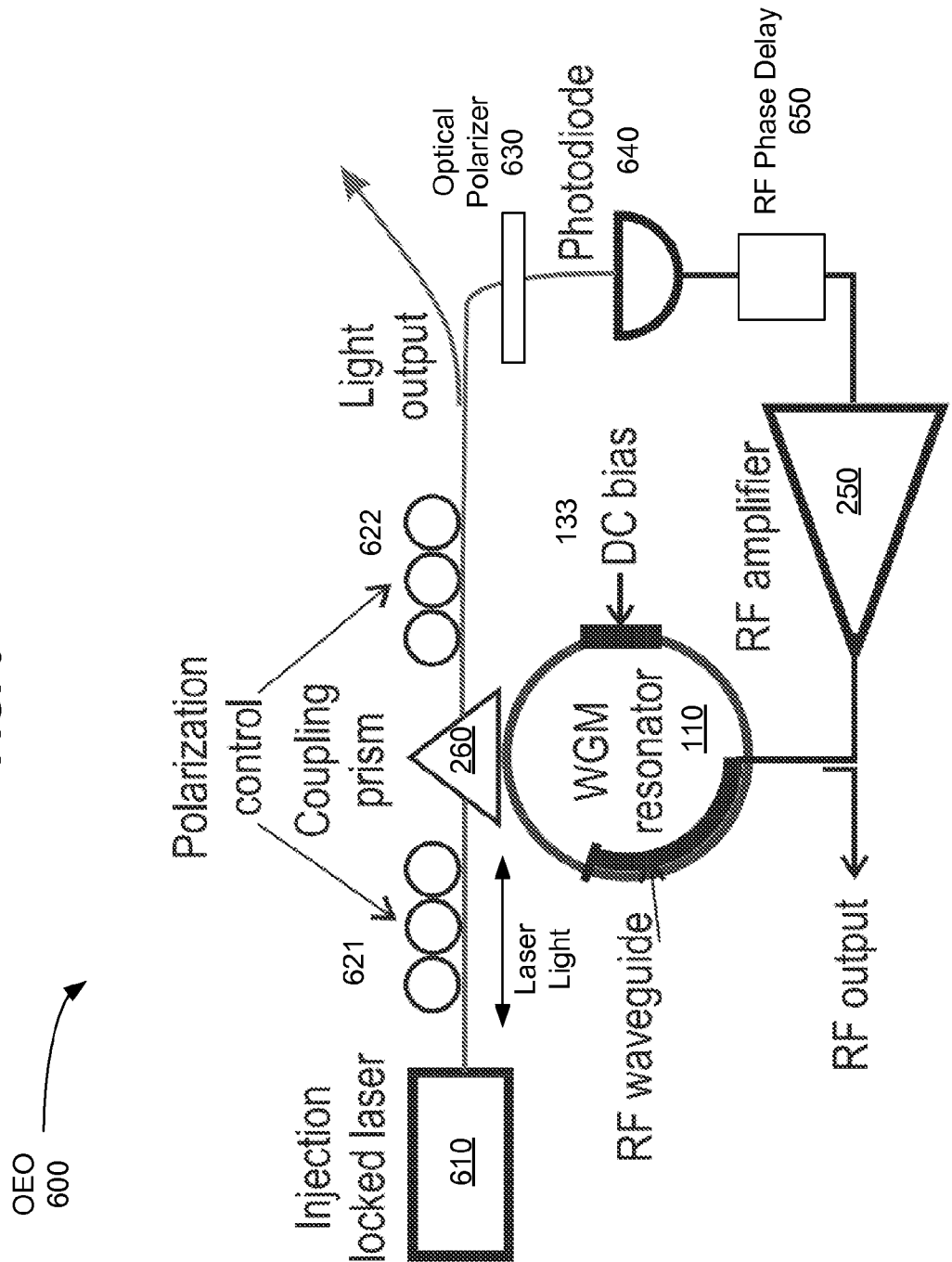
Figure 7:
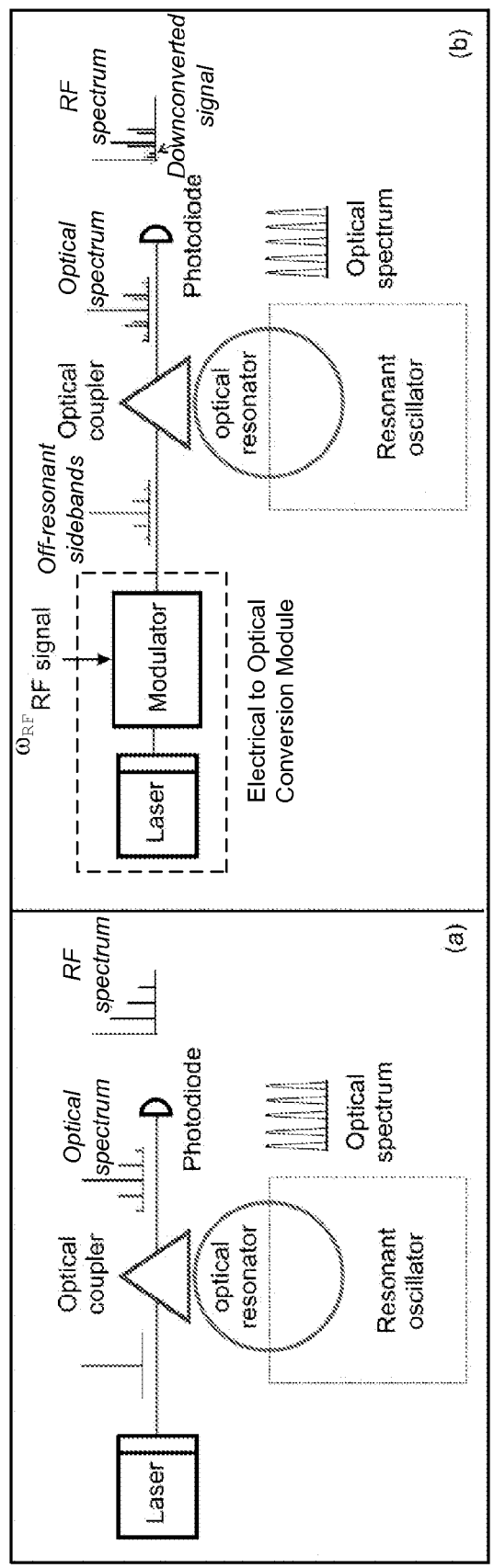
FIGS. 7, 8, 9 and 10 show examples of photonic frequency conversion devices.
Figure 8:
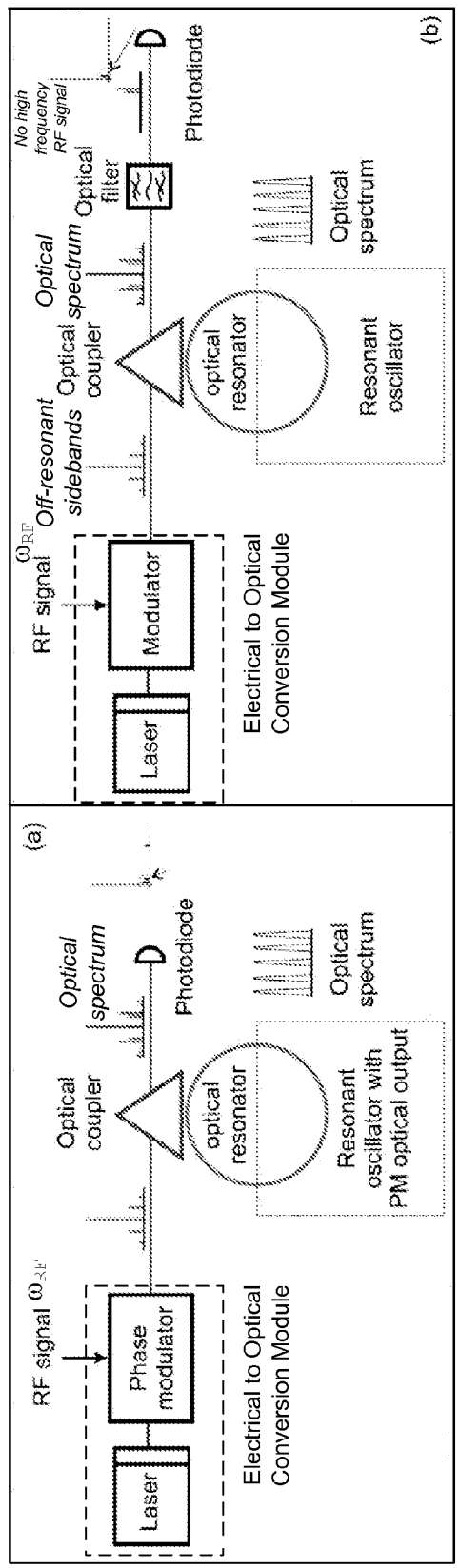

As specific examples, WGM resonators made of $LiNbO_3$ and $LiTaO_3$ can be used for SSB modulators to create coupling between light and RF fields, achieved by engineering the shape of a micro-strip RF resonator coupled to a WGM resonator. FIG. 5 shows an example of such a SSB modulator based on an electro-optic WGM resonator and FIG. 6 shows measurements obtained from this SSB modulator.

In FIG. 5, a toroidal WGM resonator is placed to a conductive substrate and an rf electric field is applied to its rim. The resonator is fabricated of Z-cut lithium tantalate and the symmetry axis of the resonator coincides with the c axis of the crystal. The stripline rf electrode is situated in the direct vicinity of the localization of the basic WGM sequence. The electrode is designed in such a way that the rf electric field is polarized orthogonally to the surface of the resonator and is maximized at the extremity perimeter of the resonator. A dc electric field is applied along the Z axis of the resonator to tune the WGM spectrum.

Light from a laser is coupled into and out of the WGM resonator via a coupling prism. Optical collimators are used for coupling light into and out of the prism in such a way that the fundamental TM and TE mode sequences (the closest to the resonator surface) are excited with the light. In conducted tests, a WGM resonator of a diameter of 935 µm and 100 µm in thickness was used and was measured to have an optical free spectral range of 48 GHz. The rim of the resonator was shaped as a toroid such that the cross section of the modes belonging to the basic WGM family with nearly orthogonal polarizations was an ellipse with dimensions of 1.6 µm and 7.5 µm. All the modes have approximately the same intrinsic (unloaded) quality factor resulting from the material absorption, reaching $6 \times 10^8$ at 1550 nm for the particular sample. The resonator was overloaded with the prism so that the FWHM of the TE and TM modes became 1 and 20 MHz, respectively.

As illustrated in FIG. 5, a first polarization controller is provided between the laser and the WGM resonator to control the input polarizaiton so that both light in both TM and TE modes is present in the resonator. A second polarizaiton controller in the output path of the light coupled out of the resonator. Two photodetectors are used in FIG. 5 to measure different signal components in the output light of the SSB modulator. A fast photodiode is used to measure the RF output and a slow photodiode is used to measure the DC output. In this SSB WGM modulator, the pump light and the light in the single sideband are orthogonally polarized with respect to each other. This feature allows for implementation of a polarization selective detection to reduce the noise in the optical to RF conversion part of the device.

The SSB modulator is tunable by tuning either or both of the temperature of the resonator and the DC voltage applied to the top and the bottom surfaces of the resonator. Tests were conducted to show a frequency shift of the WGM spectrum caused by the temperature change and the DC voltage change. The TE and the TM modes shift with different rates so that the relative frequency of the mode families changes resulting in modification of the modulation frequency. Measurements showed 1 GHz/K thermal and 80 MHz/V electro-optical shifts of the modulation frequency. In tuning the modulation frequency, the frequency of the laser carrier is tuned to follow one of the WGMs. One of the advantages of the electro-optical frequency tuning is its agility, and the tuning speed reaches 1 GHz/µs for the setup reported here. The tunability range can approach tens of gigahertz and is fundamentally limited either by the damage of the material with the applied dc electric field (2 kV/mm for stoichiometric LiTaO3) or by the mechanical damage from the differential thermal expansion of the setup.

In the interaction of the light confined in TE and TM mode families for achieving the single sideband modulation in the above WGM resonator having an FSR of 48 GHz, the second sideband rejection (SSR) was measured to be greater than 70 dBc. The modulation frequency was tuned from 10.5 GHz to 14.5 GHz with +50 V DC bias change and this tuning can be readily extended to 20 GHz and beyond using a DC bias voltage of ±100 V or greater applied to the resonator. Wider band thermal tunability was also demonstrated. The possibility of increasing the modulation bandwidth of the EOMs without significant efficiency deterioration one of advantages of the SSB modulation. The RF bandwidth of the tested SSB modulator was approximately 20 MHz. Wider bandwithds of 1 GHz or more can be achieved by using smaller WGM resonators and the interaction of different WGM families.

The cross-modulation between two different families of WGM modes of different polarizations in the WGM resonator is used to achieve the SSB modulation. In optically transparent ferroelectrics crystals, e.g., lithium niobate and lithium tantalite, electro-optical indexes of ordinary and extraordinary polarization differ significantly. This allows simple and efficient differential detuning of one WGM mode in one polarization from another WGM mode in an orthogonal polarization by a tuning mechanism that tunes both mode frequencies, e.g., adjusting the DC bias voltage. This DC vias voltage can be mixed with an additional microwave field of frequency equal to difference of resonant optical frequencies the modes would interact if the phase is properly matched in a collinear configuration.

The above tunable SSB modulator based on an electro-optic WGM resonator can be used to form a tunable opto-electronic oscillator (OEO) based on the SSB modulator. The whispering mode gallery mode resonator is made of an electro-optic material as the optical modulator to modulate the CW laser light from a laser, to filter the modulated laser light and to provide at least a part of the optical delay in the feedback loop. The electro-optic material supports two mutually orthogonal polarizations which may be referred to as the original wave and the extra-ordinary wave, or the TM mode and the TE mode. These two different polarized waves undergo a frequency shift with respect to each other in the electro-optic WGM resonator modulator and proper control of the polarization in OEO feedback loop can be used to produce one modulation sideband in the detector output of an optical detector that interconnects the electrical portion and the optical portion of the feedback loop. Therefore, a single sideband (SSB) modulation can be achieved in the OEO and provides a flexible operating frequency range that is not limited by the FSR of the WGM resonator.

FIG. 6 shows an example of an OEO 600 based on the above cross modulation of two polarization modes in the WGM resonator 110. The semiconductor laser 610 is injection locked to the lithium niobate or tantalate resonator 110 arranged as a SSB modulator. The output of the modulator 110 may be sent to a semiconductor optical amplifier (SOA) before entering a long length of fiber that is directs light to the optical detector 920. The optical detector 640 produces an electric signal that is amplified before being fed back to the modulator 110 to complete the OEO loop. The narrow bandwidth of the resonator 110 provides the filter function for the loop, and the change in the mode spacing produced by the applied DC voltage bias tunes the frequency. A phase delay control module can be implemented in the OEO loop to adjust the phase delay of the loop for tuning the OEO. For example, an RF phase delay 650 can be inserted in the electrical portion of the OEO loop to provide this phase delay adjustment. A variable optical delay element can also be inserted into the optical portion of the OEO loop to provide this control. A combination of the optical delay control and the RF delay control may be implemented.

The OEO 600 implements two polarization controllers 621 and 622 to achieve the cross modulation of the two polarization modes in the resonator 110. The first polarization controller 621 is placed in the optical path (e.g., the fiber) between the laser 610 and the evanescent coupler 260 to place the polarization of the laser light at 45 degrees with respect to either one of the two orthogonal polarizations in the resonator 110. Under this input polarization configuration, one half of the input laser light is coupled into the WGM resonator and the remaining one half is reflected, without entering into the resonator 110, to pass through the evanescent prism coupler 914 into the output optical path to the optical detector 640. The one half of the laser light coupled into the resonator 110 is modulated and filtered and is then coupled out by the coupler 260 to overlap with the reflected laser input light. The combined light is then directed into the detector 640.

Notably, the SSB modulator operates based on coupling of TE and TM modes and the SSB signal is orthogonally polarized to the pump light that is used to pump the WGM resonator 110. An optical polarizer 630 can be inserted in front of the detector 640 to reject the light at the optical carrier frequency of the pump light and to transmit light in the orthogonal polarization which is the SSB signal. This polarization-selective detection can increase the signal suppression of the OEO and improves the stability and performance of the OEO.

Hence, it is possible to achieve multiple functions in a tunable OEO: optical modulation of light, optical filtering, optical delay and optical tuning of the frequency, with a single WGM resonator made with an electro-optic crystal. WGM resonators are axio-symmetric dielectric structures that support modes with very high quality factors (e.g., $2\times10^9$). Such WGM resonators can be configured so that sidebands on the optical carrier at the RF frequency are generated at the output when an optical mode is excited with the pump laser light and a RF signal with a frequency corresponding to the free spectral range (FSR) of the resonator are simultaneously applied. This scheme is used to realize an efficient EOM. Such a modulator can improve the OEO properties.

Based on above, an OEO can include a laser that is tunable and produces a laser beam at a laser frequency; and an electrically controllable optical modulator to receive the laser beam and to modulate the laser beam to produce a modulated laser beam. The optical modulator includes an optical resonator exhibiting an electro-optic effect and structured to support whispering gallery modes circulating in the optical resonator in two mutually orthogonal polarizations and being optically coupled to the laser to receive a portion of the laser beam into the optical resonator, and electrodes formed on the optical resonator to apply a modulation control signal to effectuate an optical modulation of light based on the electro-optic effect. This photonic device also includes an active opto-electronic feedback loop that comprises an optical part coupled to the optical resonator to receive the modulated laser beam and an electrical part that produces the modulation control signal, and an optical detector coupled between the optical part and the electrical part and the opto-electronic feedback loop feeds the modulation control signal in phase to the electrodes on the optical resonator to generate and sustain both optical modulation and electrical oscillation at the modulation frequency of the modulator. A polarization control mechanism is provided in this photonic device to control polarization of light received at the optical detector to allow light in the two mutually orthogonal polarizations to interfere at the optical detector to produce a single modulation sideband so that a modulation frequency of the modulator at a difference between frequencies of whispering gallery modes at the two mutually orthogonal polarizations inside the optical resonator.

FIGS. 7-10 illustrate several exemplary configurations of photonic frequency up- and down-converters for RF or microwave signals. The devices operate to shift the carrier frequency of the RF signal up or down. The same optical pumping light is used for both the upconversion the RF signal to the optical domain and for pumping an RF photonic oscillator generating highly stable optical sidebands. The upconverted RF signal and the signal from the RF photonic oscillator are then processed (e.g. filtered) and downconverted to RF frequency domain using a fast photodiode. The unique resonant nature of the RF photonic oscillator allow using the same optical train to transfer the optical pump, the upconverted RF signal, and the signal from the RE photonic oscillator. This design eliminates the need for balanced interferometric structures in signal detection.

In these examples, an electrical to optical conversion module is used to receive an input RF signal and produce a modulated optical signal that is at an optical carrier frequency and carries the input RF signal. The optical resonator supports optical resonator modes and exhibits a frequency difference between two adjacent optical resonator modes that is different from an RF frequency of the input RF signal. The light that is coupled out of the optical resonator as an optical output signal carries two sets of optical sidebands: a first set of optical sidebands corresponding to the RF signal and a second set of optical sidebands corresponding to the optical resonator modes. The optical detector is located to receive the optical output signal coupled out of the optical resonator. The optical detector converts the received optical output signal into an output electrical signal that is a replica of the input RF signal at an output electrical signal frequency that is shifted from the RF frequency of the input RF signal.

FIG. 7(a) shows an RF photonic oscillator. The oscillator is an active nonlinear device that uses optical pump power from the laser to generate optical sidebands around the optical pump carrier frequency. This oscillator can be configured as an opto-electronic oscillator (OEO), or a hyperparametric oscillator, or an opto-mechanical oscillator. However implemented, the oscillator includes an optical resonator possessing a discrete optical spectrum. Examples of hyperparametric oscillators based on WGM resonators are described in U.S. Pat. No. 7,630,417 entitled "Crystal whispering gallery mode optical resonators" which is incorporated by reference as part of this document. Crystal WGM resonators with high quality factors can be used to generate optical hyperparametric oscillations caused by nonlinear wave mixing at low thresholds. In one implementation for generating optical hyperparametric oscillations, a laser beam from a laser is split into a first laser beam into a first optical arm of a Mach-Zehnder interferometer and a second laser beam into a second optical arm of the Mach-Zehnder interferometer. A whispering-gallery-mode resonator formed of a fluorite crystal material is inserted in the first optical arm of the Mach-Zehnder interferometer to receive the first laser beam from an input end of the first optical arm and to output a filtered first laser beam to an output end of the first optical arm. The filtered first laser beam and the second laser beam are combined to produce a combined beam as an output of the Mach-Zehnder interferometer. The combined beam is converted into a detector signal to observe an optical hyperparametric oscillation caused by a nonlinear mixing in the resonator.

In the present frequency conversion devices, the optical pump from the laser is resonant with one of the resonator modes. The nonlinear frequency conversion within the oscillator results in coherent generation of light at the frequencies determined by the spectrum of the optical resonator (optical sidebands). The frequency difference between the optical pump carrier and the generated optical sidebands $\Delta\omega$ is stable, so the optical signal, being demodulated on a fast photodiode, generates a spectrally pure RF signal at the frequency given by $\Delta\omega$.

FIG. 7(b) shows an example of a photonic frequency conversion device based on the oscillator in FIG. 7(a). The device includes an electrical to optical conversion module that receives an input radio frequency (RF) signal and produces a modulated optical signal that is at an optical carrier frequency and carries the input RF signal; and a photonic oscillator that includes, when in an OEO configuration, a closed opto-electronic loop having an optical part that includes an optical resonator, an electrical part and a loop optical detector coupled between the optical part and the electrical part to convert light received from the optical part into an electrical signal to the electrical part. The optical resonator is configured to support optical resonator modes and to exhibit a frequency difference between two adjacent optical resonator modes that is different from an RF frequency of the input RF signal. This device includes an optical coupler that couples light of the modulated optical signal into the optical resonator and couples light out of the optical resonator as an optical output signal that carries a first set of optical sidebands corresponding to the RF signal and a second set of optical sidebands corresponding to the optical resonator modes; and an optical detector located to receive the optical output signal coupled out of the optical resonator, the optical detector converting the received optical output signal into an output electrical signal that is a replica of the input RF signal at an output electrical signal frequency that is shifted from the RF frequency of the input RF signal.

The device in FIG. 7(b) can be configured as an RF frequency downconverter based on the RF photonic oscillator. The oscillator is pumped with modulated light, where the modulation is in situ the RF signal upconverted to the optical domain via an additional modulator (electro-optical, electro-absorptive, etc.) or directly fed to the laser to modulate the laser light without the separate optical modulator. The signal carrier frequency $\omega_{RF}$ is different from the frequency corresponding to the difference between the pumped mode of the optical resonator and any other mode of the resonator ($\Delta\omega$ and others).

In operation, the signal sidebands do not interact with the resonator and do not influence the properties of the opto-electronic oscillator. The light escaping the optical resonator has two families of optical sidebands, one related to the RF signal, and the other related to the oscillator. The light with the sidebands is received and demodulated on a fast photodiode to generate an RF signal with an RF spectrum that contains the original RF signal at the frequency equal to the smallest frequency difference between the signal sidebands and the oscillator sidebands ($|\Delta\omega-\omega_{RF}|$). This is the downconverted RF signal. The frequency of the signal can be modified by either changing the frequency of the input RF signal, or oscillation frequency of the RF photonic oscillator.

FIG. 8(a) shows that the RF spectrum generated by the frequency downconverter shown in FIG. 7(b) may have many high frequency RF harmonics corresponding to the frequency of the RF photonic oscillator ($\Delta\omega$) and the initial frequency of the RF signal ($\omega_{RF}$). Those harmonics are undesirable and can be removed by signal filtering in the optical domain without using RF filtering.

In some implementations, a phase modulator can be used for the upconversion of the RF signal to the optical domain and an RF photonic oscillator is used for generating phase modulated light. In this case, the light absorbed on a photodiode does not produce any RF harmonics corresponding to the signal or oscillation frequency and the photodiode produces harmonics proportional to combinational frequencies $|\Delta\omega-\omega_{RF}|$ and $\Delta\omega+\omega_{RF}$. One example of techniques for removing all but one ($|\Delta\omega-\omega_{RF}|$) combination frequencies is shown in FIG. 8(b) where an optical band-pass filter is located in an optical path between the resonator and the photodiode to transmit only two close sidebands belonging to the RF signal and the RF photonic oscillator to the photodiode.

Figure 9:
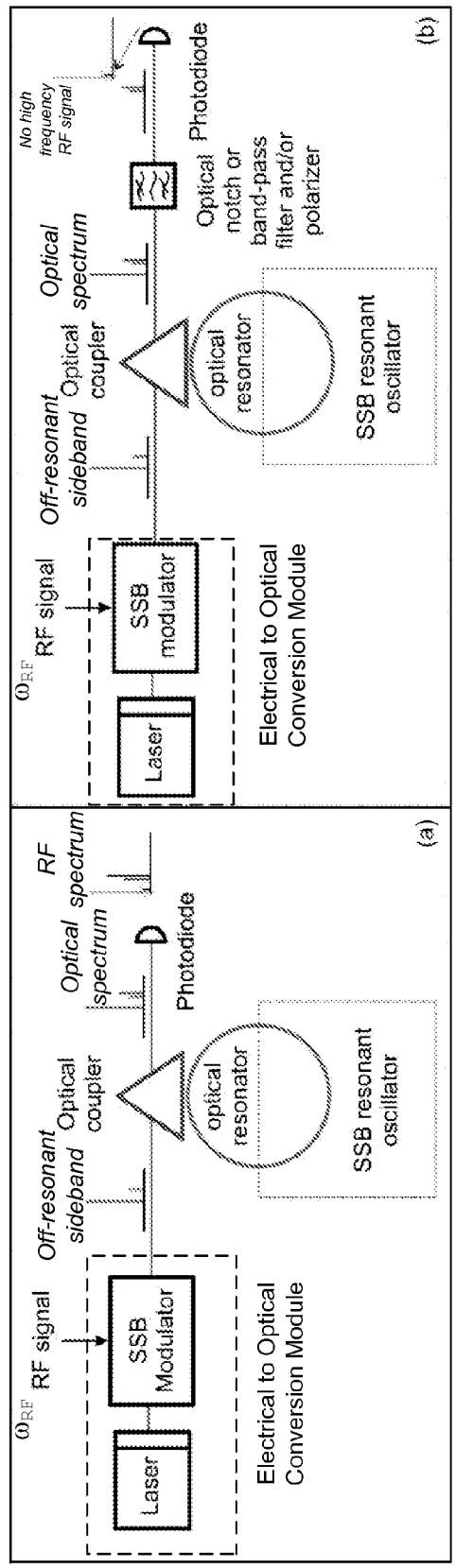
Figure 10:
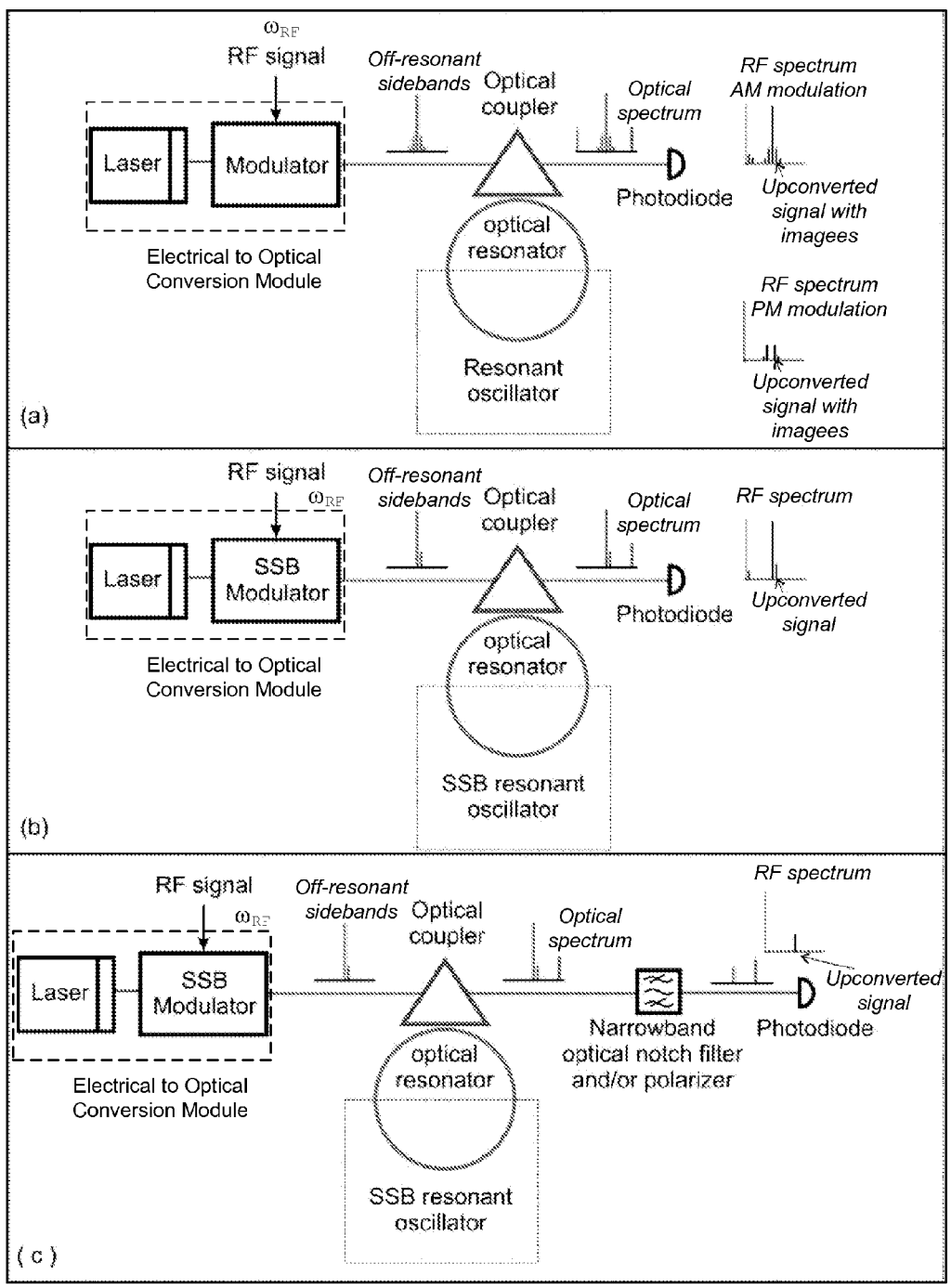

The above described SSB modulator can be used for frequency conversion as illustrated in FIGS. 9 and 10.

FIG. 9(a) show an example where a SSB modulator and a SSB oscillator are used to reduce the number of unwanted RF harmonics.

FIG. 9(b) shows that optical filtering can be provided in the optical path between the resonator and the photodiode. Such filtering can be achieved by using an optical notch filter to reject the optical carrier, or a band-pass filter to transmit the wanted optical sidebands, or a polarizer to reject the carrier in the case of oppositely polarized carrier and sidebands. Such filtering allows generation of a downconverted RF signal with suppressed unwanted RF harmonics. The SSB modulator and the SSB oscillator are tunable in frequency and thus tenability can be used to modify the frequency of the transformed RF signal in real time.

FIG. 10 shows three examples of frequency conversion devices for upconversion operations. The RF signal is designed to have a frequency much smaller than the frequency of the RF photonic oscillator. Demodulation of the modulated light on the fast photodiode results in an upconverted RF signal as shown in FIG. 10(a). The upconverted signal has an image as well as other RF components. In FIG. 10(b), an SSB modulator is used to remove the undesired image. The combination of the SSB modulator and a filter can be used to produce the upconverted signal free of other sidebands.

The device in FIG. 10(c) is identical in structure to the device in FIG. 9(b) and is operated by using a RF signal frequency much smaller than the oscillator frequency for frequency upconversion while the device in FIG. 9(b) uses a RF signal frequency close to the oscillator frequency for frequency downconversion. Therefore, the difference between the RF signal frequency and the oscillator frequency can be adjusted to set the device to operate in either the upconversion or downconversion mode.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations, modifications and enhancements of the disclosed implementations and other implementations can be made based on what is described and illustrated in this document.

What is claimed is:

1. A method for converting a frequency of a signal based on photonic processing, comprising:
   producing a modulated optical signal that is at an optical carrier frequency and carries an input radio frequency (RF) signal;
   coupling light of the modulated optical signal into an optical resonator that supports optical resonator modes and exhibits a frequency difference between two adjacent optical resonator modes that is different from an RF frequency of the input RF signal;
   coupling light out of the optical resonator as an optical output signal that carries a first set of optical sidebands corresponding to the RF signal and a second set of optical sidebands corresponding to the optical resonator modes; and
   using an optical detector to convert the optical output signal into an output electrical signal that is a replica of the input RF signal at an output electrical signal frequency that is shifted from the RF frequency of the input RF signal.

2. The method as in claim 1, wherein the output electrical signal frequency is down shifted from the RF frequency of the input RF signal.

3. The method as in claim 1, wherein the output electrical signal frequency is up shifted from the RF frequency of the input RF signal.

4. The method as in claim 1, comprising:
   using an optical bandpass filter to filter the optical output signal out of the optical resonator to control the output electrical signal frequency that is shifted from the RF frequency of the input RF signal.

5. The method as in claim 4, wherein the optical bandpass filter is used to select a first sideband from the first set of optical sidebands corresponding to the RF signal and a second sideband from the second set of optical sidebands corresponding to the optical resonator modes to transmit through the optical bandpass filter to reach the optical detector while blocking other optical sidebands from reaching the optical detector.

6. The method as in claim 1, comprising:
   using an optical notch filter to filter the optical output signal out of the optical resonator to remove light at the optical carrier frequency in the optical output signal.

7. The method as in claim 1, wherein the optical resonator is part of an opto-electronic oscillator.

8. A device for converting a frequency of a signal based on photonic processing, comprising:
   an electrical to optical conversion module that receives an input radio frequency (RF) signal and produces a modulated optical signal that is at an optical carrier frequency and carries the input RF signal;
   an optical resonator that supports optical resonator modes and exhibits a frequency difference between two adjacent optical resonator modes that is different from an RF frequency of the input RF signal;
   an optical coupler that couples light of the modulated optical signal into the optical resonator and couples light out of the optical resonator as an optical output signal that carries a first set of optical sidebands corresponding to the RF signal and a second set of optical sidebands corresponding to the optical resonator modes; and an optical detector located to receive the optical output signal coupled out of the optical resonator, the optical detector converting the received optical output signal into an output electrical signal that is a replica of the input RF signal at an output electrical signal frequency that is shifted from the RF frequency of the input RF signal.

9. The device as in claim 8, wherein the electrical to optical conversion module includes a laser that produces a continuous wave laser beam at the optical carrier frequency and an optical modulator that applies the input RF signal to modulate the laser beam to produce the modulated optical signal.

10. The device as in claim 8, wherein the electrical to optical conversion module includes a laser that produces a laser beam at the optical carrier frequency and applies the input RF signal to directly modulate the laser beam, without a separate optical modulator, to produce the modulated optical signal.

11. The device as in claim 8, comprising:
an optical bandpass filter located in an optical path between the optical resonator and the optical detector to filter the optical output signal out of the optical resonator to control the output electrical signal frequency that is shifted from the RF frequency of the input RF signal.

12. The device as in claim 11, wherein the optical bandpass filter is used to select a first sideband from the first set of optical sidebands corresponding to the RF signal and a second sideband from the second set of optical sidebands corresponding to the optical resonator modes to transmit through the optical bandpass filter to reach the optical detector while blocking other optical sidebands from reaching the optical detector.

13. The device as in claim 8, comprising:
an optical notch filter located in an optical path between the optical resonator and the optical detector to filter the optical output signal out of the optical resonator to remove light at the optical carrier frequency in the optical output signal.

14. The device as in claim 8, comprising:
an opto-electronic oscillator that includes a closed opto-electronic loop having an optical part that includes the optical resonator, an electrical part and a loop optical detector coupled between the optical part and the electrical part to convert light received from the optical part into an electrical signal to the electrical part.

15. The device as in claim 14, wherein the optical resonator exhibits an electro-optic effect and receives an electrical control signal from the electrical part of the closed opto-electronic loop.

16. A device for converting a frequency of a signal based on photonic processing, comprising:
an electrical to optical conversion module that receives an input radio frequency (RF) signal and produces a modulated optical signal that is at an optical carrier frequency and carries the input RF signal;
a photonic oscillator that includes a closed opto-electronic loop having an optical part that includes an optical resonator, an electrical part and a loop optical detector coupled between the optical part and the electrical part to convert light received from the optical part into an electrical signal to the electrical part, the optical resonator configured to support optical resonator modes and to exhibit a frequency difference between two adjacent optical resonator modes that is different from an RF frequency of the input RF signal;
an optical coupler that couples light of the modulated optical signal into the optical resonator and couples light out of the optical resonator as an optical output signal that carries a first set of optical sidebands corresponding to the RF signal and a second set of optical sidebands corresponding to the optical resonator modes; and
an optical detector located to receive the optical output signal coupled out of the optical resonator, the optical detector converting the received optical output signal into an output electrical signal that is a replica of the input RF signal at an output electrical signal frequency that is shifted from the RF frequency of the input RF signal.

17. The device as in claim 16, wherein the electrical to optical conversion module includes a laser which produces laser light at the optical carrier frequency and is optically coupled to the optical resonator via the optical coupler to be optically locked to an optical resonator mode via injection locking.

18. The device as in claim 16, wherein the optical resonator supports optical whispering gallery modes and the optical coupler is an evanescent optical coupler.

19. The device as in claim 18, wherein the optical resonator is made of an electro-optic crystal and structured to support optical whispering gallery modes in two orthogonally polarized transverse electric (TE) modes and transverse magnetic (TM) modes circulating near a rim of the optical resonator, and
wherein the device comprises:
electrodes formed on the optical resonator to receive an electrical signal from the electrical part in an electric field polarization oriented relative to a crystal axis of the electro-optic crystal to effectuate coupling between an optical whispering gallery mode in the TE mode and another optical whispering gallery mode in the TM mode to produce an optical single sideband on light in the optical resonator at a frequency different from the optical carrier frequency; and
a frequency control mechanism coupled to the optical resonator to tune a frequency spacing between the optical single sideband and the optical carrier frequency.

20. The device as in claim 19, comprising:
an optical polarizer located in an optical path between the optical resonator and the optical detector to reject the light at the optical carrier frequency and to transmit light of the optical single sideband.

* * * * *